(12) United States Patent
Sinning (10) Patent No.: US 10,586,750 B2
(45) Date of Patent: Mar. 10, 2020

(54) STACKABLE POWER MODULE

(71) Applicant: HS Electronik Systeme Gmbh, Noerdingen (DE)

(72) Inventor: Richard Sinning, Schnelldorf (DE)

(73) Assignee: HS ELEKTRONIK SYSTEME GMBH, Nördlingen (DE)

( * ) Notice: Subject to any disclaimer, the term of this patent is extended or adjusted under 35 U.S.C. 154(b) by 0 days.

(21) Appl. No.: 15/918,074

(22) Filed: Mar. 12, 2018

(65) Prior Publication Data
US 2018/0269129 A1    Sep. 20, 2018

(30) Foreign Application Priority Data

Mar. 14, 2017  (EP) .................................... 17160852

(51) Int. Cl.
*H01L 23/367* (2006.01)
*H01L 23/36* (2006.01)
(Continued)

(52) U.S. Cl.
CPC .......... *H01L 23/3675* (2013.01); *H01L 23/36* (2013.01); *H01L 23/3677* (2013.01); *H01L 23/4951* (2013.01); *H01L 23/49568* (2013.01); *H01L 24/41* (2013.01); *H01L 25/074* (2013.01); *H01L 25/117* (2013.01); *H01L 25/16* (2013.01); H01L 23/4012 (2013.01); H01L 2224/4118 (2013.01); H01L 2225/1094 (2013.01); H01L 2924/1033 (2013.01); H01L 2924/10253 (2013.01); H01L 2924/10272 (2013.01); H01L 2924/1203 (2013.01); H01L 2924/12032 (2013.01); H01L 2924/12036 (2013.01); H01L 2924/1301 (2013.01);
(Continued)

(58) Field of Classification Search
CPC ............ H01L 23/3675; H01L 23/5951; H01L 23/3677; H01L 23/34; H01L 23/49568; H01L 23/4012; H01L 23/06; H01L 23/528; H01L 23/3121; H01L 23/5226; H01L 25/074; H01L 25/16; H01L 25/117; H01L 25/0652; H01L 24/41
See application file for complete search history.

(56) References Cited

U.S. PATENT DOCUMENTS 7,598,600 B2  10/2009  Tang et al.
9,107,290 B1   8/2015  Chen
(Continued)

OTHER PUBLICATIONS

Extended European Search Report for International Application No. 17160852.4 dated Oct. 2, 2017, 7 pages.

*Primary Examiner* — Galina G Yushina
(74) *Attorney, Agent, or Firm* — Cantor Colburn LLP (57) ABSTRACT

The present invention relates to a stackable power module, comprising a module body having a top side and a bottom side provided with top and bottom contact pads, each of the top contact pads electrically connected to a corresponding bottom contact pad; at least one power semiconductor device embedded in the module body, at least one conductive structure connecting the power semiconductor device to a respective top and/or bottom contact pad, wherein the at least one conductive structure has a thermal capacity sufficient to take up an amount of heat generated during a switching cycle of the at least one power semiconductor device without increasing temperature above a critical threshold.

14 Claims, 3 Drawing Sheets

(51) Int. Cl.
  *H01L 25/16* (2006.01)
  *H01L 23/00* (2006.01)
  *H01L 23/40* (2006.01)
  *H01L 25/11* (2006.01)
  *H01L 25/07* (2006.01)
  *H01L 23/495* (2006.01)

(52) U.S. Cl.
  CPC .............. *H01L 2924/13055* (2013.01); *H01L 2924/13091* (2013.01); *H01L 2924/19043* (2013.01); *H01L 2924/19105* (2013.01)

(56) References Cited

U.S. PATENT DOCUMENTS

| | | |
|---|---|---|
| 9,495,498 B2 | 11/2016 | Bartley et al. |
| 2006/0055017 A1 | 3/2006 | Cho |
| 2010/0078783 A1* | 4/2010 | Otremba ............. H01L 23/5389 257/676 |
| 2010/0078807 A1* | 4/2010 | Schulz ................... H01L 23/34 257/713 |
| 2013/0200376 A1* | 8/2013 | Yamazaki ........... H01L 29/7869 257/57 |
| 2014/0110863 A1 | 4/2014 | Cho |
| 2015/0200154 A1* | 7/2015 | Choi .................... H01L 23/481 257/777 |
| 2017/0278764 A1* | 9/2017 | Partington ............ H01L 23/055 |

\* cited by examiner

STACKABLE POWER MODULE

FOREIGN PRIORITY

This application claims priority to European Patent Application No. 17160852.4 filed Mar. 14, 2017, the entire contents of which is incorporated herein by reference.

DESCRIPTION

The present invention relates to a stackable power module which includes a circuitry of semiconductor chips and passive electronic components or a single semiconductor chip. Such power modules may be suitable for use in high performance power electronic applications and in particular in an aircraft. One example is a solid state power controller (SSPC) made up with a plurality of power modules connected in parallel.

Power modules are devices for converting and controlling the flow of electric energy and are used as inverters, DC/DC converters, controllers and other power conversion devices. Power modules are widely used in homes, industries, automobiles, aircraft, wherever power must be converted or controlled. Power semiconductor devices, including diodes, thyristors, power MOSFETS and IGBTs, are typically assembled to form power modules, which may contain a plurality of such power semiconductor and other devices.

Controlling and converting power in power semiconductor devices of the type described above produces significant heat. In applications like SSPCs additional heat is usually generated when switching a power semiconductor device. This heat will increase the temperature of the power module to the point of failure of the power semiconductor devices. Therefore, efficient heat management is a main requirement for electrical equipment using power semiconductor devices of this type. High voltage and current load has an additional impact on Power modules.

Conventionally, a plurality of power semiconductor devices are connected in parallel to share load requirements and keep the amount of heat generated when switching individual power semiconductor devices below critical thresholds. However, this requires a large number of power semiconductor devices on a printed circuit board, thus increasing space requirements and limiting power density.

Therefore, it would be beneficial to have an improved configuration for a power module allowing more efficient assembly and/or better utilization of space while still providing sufficient heat dissipation capability.

One aspect relates to a stackable power module, comprising a module body having a top side and a bottom side provided with top and bottom contact pads, each of the top contact pads electrically connected to a corresponding bottom contact pad; at least one power semiconductor device embedded in the module body, at least one conductive structure connecting the power semiconductor device to a respective top and/or bottom contact pad, wherein the at least one conductive structure has a thermal capacity sufficient to take up an amount of heat generated during a switching cycle of the at least one power semiconductor device without increasing temperature above a critical threshold.

The power semiconductor device particularly may be a power semiconductor chip or die. The power semiconductor device also may comprise a circuitry of semiconductor chips and passive electronic components. The power module may be mounted to a circuit board or similar, e.g. by Surface Mount Technology (SMT) or Through-Hole Mount Technology.

Another aspect relates to a solid state power controller, particularly for an aircraft, comprising a printed circuit board and a plurality of stackable power modules as described herein. The stackable power modules are stacked above each other. A lowest of the power modules is mounted to a circuit board.

The invention will be described in more detail in the following with respect to the accompanying figures.

In the following detailed description, a number of specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the device are semidiagrammatic and not to scale and, particularly, some of the dimensions are for the clarity of presentation and are shown greatly exaggerated in the drawing figures. Where multiple embodiments are disclosed and described, having some features in common, for clarity and ease of illustration, description, and comprehension thereof, similar and like features one to another will ordinarily be described with like reference numerals. Such features will only be described with respect to the first figure in which the respective feature occurs. The same description applies with respect to the same features in other figures.

The term "horizontal" as used herein is defined as a plane parallel to the conventional plane or surface of the package top, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

Figure 1:
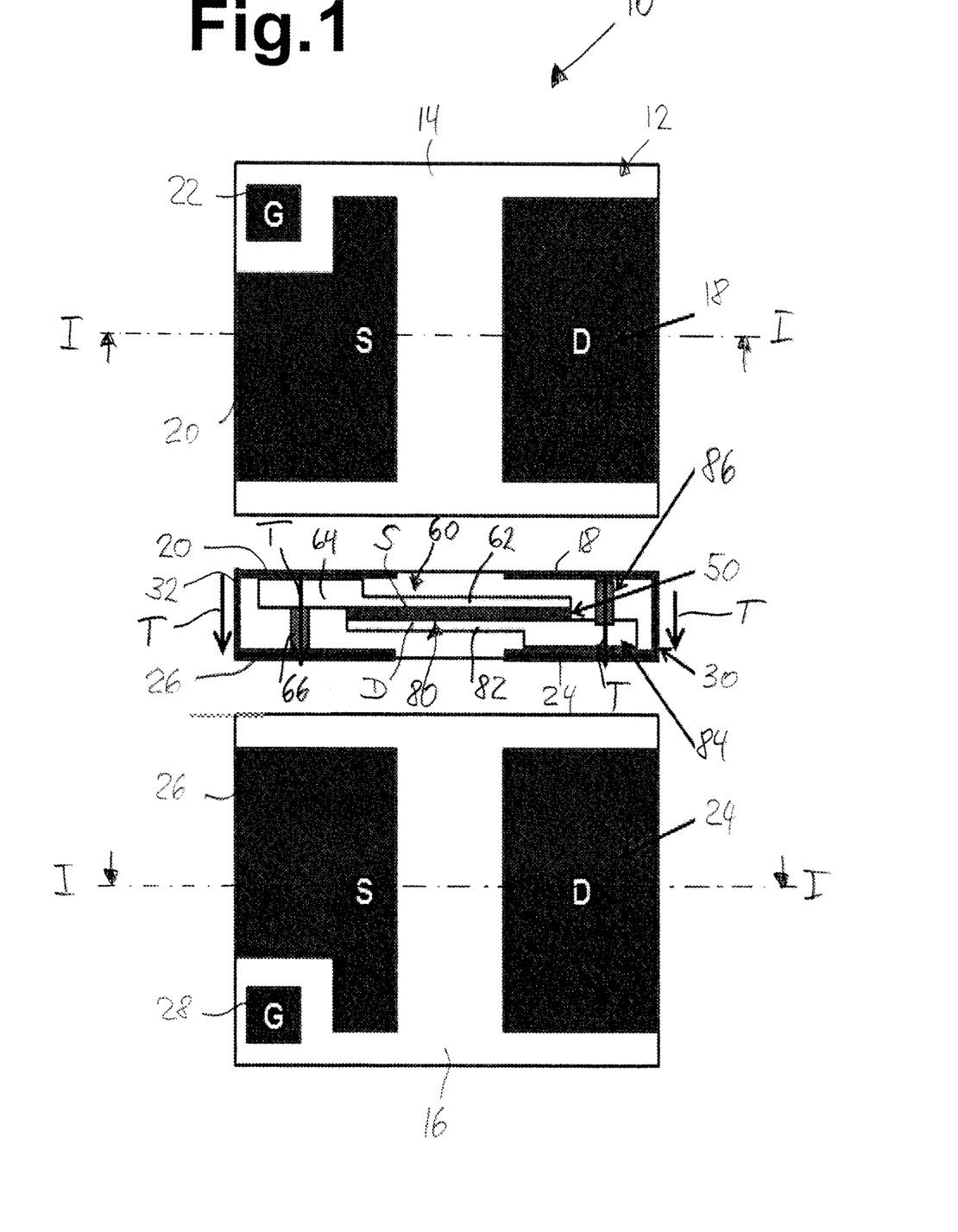
FIG. 1 shows schematic views of a power module according to an embodiment, namely a view from the top, a cross sectional view, and a view from below.

FIG. 1 is a cross-sectional view of a first embodiment of a power module 10 according to an embodiment. FIG. 1 shows three views of the power module 10, namely a view from the top (top view, upper part of FIG. 1), a view from below (bottom view, lower part of FIG. 1), and a cross sectional view along line I-I in the top view and bottom view (middle part of FIG. 1).

The stackable power module 10 comprises a module body 12 having a top side 14 and a bottom side 16 provided with top contact pads 18, 20, 22 and bottom contact pads 24, 26, 28. Each of the top contact pads 18, 20, 22 is electrically connected to a corresponding bottom contact pad 24, 26, 28. In the embodiment shown in FIG. 1 the top contact pad 18 located on the right side is electrically connected to its corresponding bottom contact pad 24 via an electrically conductive layer 30 extending along the right lateral side of the module body 12. Additional electrical connection between the top contact pad 18 and the corresponding bottom contact pad 24 is provided by a conductive structure 84 and a conductive inlay 86 which are described in more detail below. The contact pads 18 and 24 are connected to a drain pad (as indicated by "D") of the power semiconductor chip or die of the power semiconductor device 50 embedded in the power module 10. The top contact pad 20 of the module body 12 located on the left side is electrically connected to its corresponding bottom contact pad 26 via an electrically conductive layer 32 extending along the left lateral side of the module body 12. Additional electrical connection between the top contact pad 20 and the corresponding bottom contact pad 26 is provided by a conductive structure 64 and a conductive inlay 66 which are described in more detail below. The contact pads 20 and 26 are connected to a source pad (as indicated by "S" in FIG. 1) of the power semiconductor chip or die of the power semiconductor device 50 embedded in the power module 10. Further, the top contact pad 22 of the module body 12 located on the left side is electrically connected to its corresponding bottom contact pad 28. The contact pads 22 and 28 are connected to a gate pad (indicated by "G" in FIG. 1) of the power semiconductor chip or die of the power semiconductor device 50 embedded in the power module 10. The designations "D", "S", and "G" of the contact pads shown in FIG. 1 are exemplary and refer to the contact pads to be connected to power in, power out, and a control signal, respectively. In further embodiments, these contact pads could have other designations, e.g. "line", "load", and "control". Also the patterns of the contact pads 18, 20, 22, 24, 26, 28 shown in FIG. 1 are exemplary and other patterns could be realized.

Figure 3:
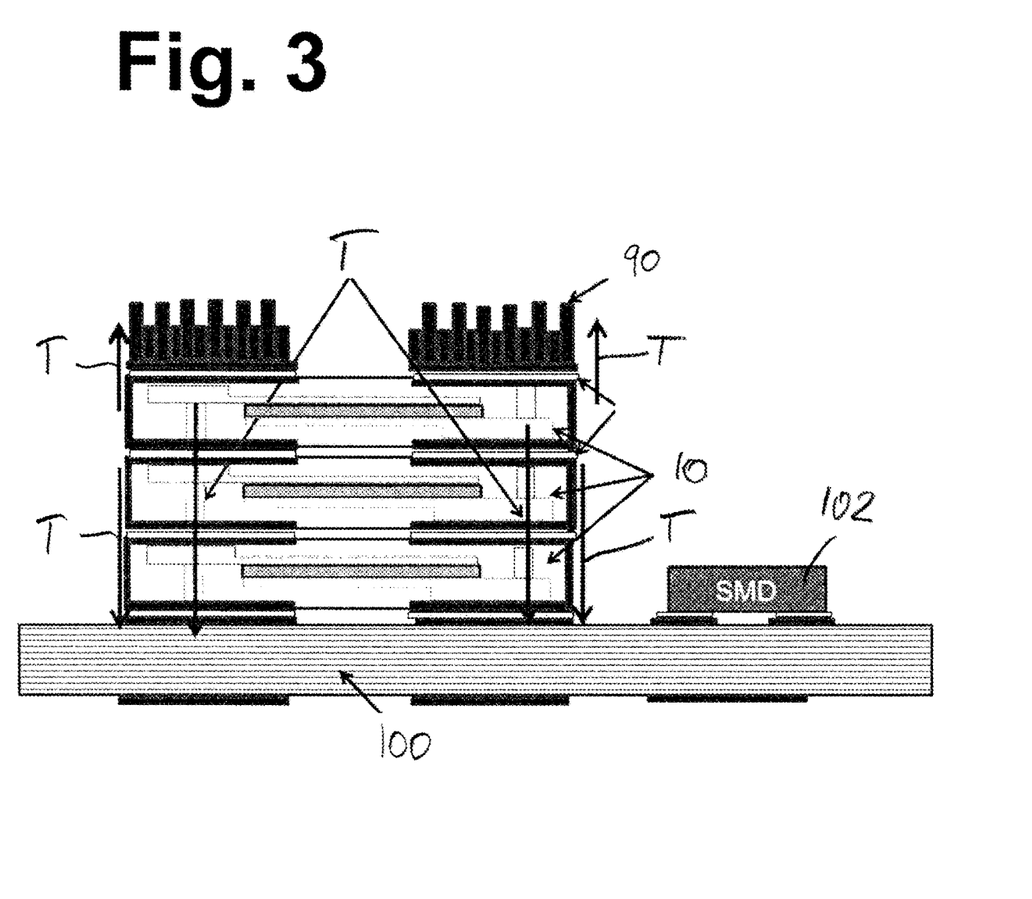
FIG. 3 shows cross a sectional view of a solid state power controller comprising a printed circuit board and a plurality of stackable modules as shown in FIG. 1.

The configuration of the power semiconductor module 10 allows that a number of individual modules 10 can be stacked on top of each other with the bottom contact pads 24, 26, 28 of an upper module 10 contacting the corresponding top contact pads 18, 20, 22 of the lower module 10, as shown in FIG. 3.

At least one power semiconductor device 50, in particular a power semiconductor switch, is embedded in the module body 10. In particular, the power semiconductor device 50 is provided as a bare semiconductor die, i.e. a "naked" semiconductor chip. Thus, the semiconductor chip or die of the power semiconductor device 50 is in a state after dicing from a larger waver, but without applying any packaging or leads. The power semiconductor device 50 is provided with a metallization, e.g. in the configuration of a copper layer, as back-end treatment. Particularly, the semiconductor chip or die is not provided with any lead frame or similar structure on the chip or die to electric leads for connecting to a socket or SMD pads of a printed circuit board. Instead of such lead frame structures, conductive structures 60, 80 are used to connect the power semiconductor device 50 to respective bonding pads 20, 24 on the top side 14 and bottom side 16 of the module body 12, as set out in more detail below. Thus, the power semiconductor module 10 provides a leadless package, and does not include any lead frames, or similar structures.

The power semiconductor device 50 may include semiconductor switches, including at least one of an insulated gate bipolar transistor (IGBT), a metal-oxide semiconductor field effect transistor (MOSFET), or a thyristor. Other power semiconductor devices like Schottky diodes, power diodes, capacitors, resistors may be provided in combination with power semiconductor switches. In particular, the power semiconductor device 50 may be an integrated circuit (also referred to as semiconductor chip or die) comprising any combination of these power semiconductor devices on a semiconductor die formed in semiconductor technology, e.g. using CMOS technology. The power semiconductor device may be made in a number of semiconductor die technologies, e.g. Si, GaN, SiC.

In the embodiment of FIG. 1, two conductive structures 60, 80 are provided in the stackable power module 10. Each of these conductive structures 60, 80 is embedded in the module body 12 and connects the power semiconductor device 50 to a respective group of corresponding contact pads provided on the top side and bottom side of the module body 12 (top and bottom contact pads 20, 26 with respect to first conductive structure 60; top and bottom contact pads 18, 24 with respect to second conductive structure 80). In FIG. 1, the conductive structure 60 is connected to a contact pad "S" on the top side of the semiconductor die of the power semiconductor device 50 and relates to the Source pad of the power semiconductor device 50 (or the "load" pad of the power semiconductor device 50 in an alternative designation). The conductive structure 60 connects the source pad "S" of the power semiconductor device 50 to contact pad 20 on the top side 14 of the module body 10 (left side in FIG. 1). Correspondingly, the conductive structure 80 is connected to a contact pad "D" on the bottom side of the power semiconductor die of the power semiconductor device 50 and relates to the drain pad of the power semiconductor device 50 (or the "line" pad of the power semiconductor device 50 in an alternative designation). The conductive structure 80 connects the contact pad "D" on the bottom side of the semiconductor die of the power semiconductor device 50 to a contact pad 24 on the bottom side 16 of the module body 12.

Each of the conductive structures 60, 80 is configured in such a way that a thermal capacity of the respective conductive structure 60, 80 is sufficiently large to take up an amount of thermal energy or heat generated during a single switching cycle of the power semiconductor device 50 with only a moderate, increase in temperature as a result of the switching cycle. The increase in temperature of the stackable power module 10 resulting from a switching cycle never exceeds a critical threshold. Thus, thermal energy or heat produced in a single switching cycle may be buffered by the conductive structures 60, 80.

Throughout this disclosure, the terms "heat" and "thermal energy" are used as synonyms. As used herein a structure is considered conductive in case the structure has both electrically conductive and thermally conductive characteristics.

Each of the conductive structures 60, 80 comprises a respective conductive contact layer 62, 82 in contact with a corresponding contact pad "S" or "D" of the semiconductor die in which the power semiconductor device 50 is formed. The contact pads "S" and "D" are formed by a metallization (e.g. using copper) of the power semiconductor die of the power semiconductor device 50. Each of the conductive contact layers 62, 82 has a sufficiently large thermal capacity to buffer thermal energy produced in a single switching cycle of the power semiconductor device 50. The conductive structures 60, 80, in particular the conductive contact layers 62, 82, may be made of any suitable electrically conductive material having a thermal capacity as large as required. E.g. the conductive structures 60, 80, in particular the conductive contact layers 62, 82, may be made of copper, silver, gold, tin, molybdenum, aluminum, or any suitable alloy of these materials (e.g. copper invar composites). Copper is a particularly well suited material. In addition to being electrically conductive and having a relatively large thermal capacity, such structures may be also very efficient with respect to transport of heat by thermal conduction. Since the conductive structures 60, 80 are thermally connected to the respective contact pads 20, 24 at the upper and lower sides of the module body 12, the conductive structures 60, 80 act as a heat sinks with respect to thermal energy produced by the power semiconductor device 50 in the course of a switching cycle. The large thermal capacity of the conductive structures 60, 80, in particular of the conductive contact layers 62, 82, provides for a buffer for temporarily taking up thermal energy produced in the course of a switching cycle. The thermal conductivity of the conductive structures 60, 80 together with their respective connections to the contact pads 20, 24 provides for an efficient path for transporting thermal energy from the stackable power module 10 towards a heat sink, e.g. the printed circuit board 100 (see FIG. 3) to which the module 10 is mounted, or to a cooling structure (90) mounted to the top side of a stack of power modules 10 (see FIG. 3). Heat management provided in this way may be more efficient than heat management achievable with single, non-stacked power modules. Thus, the power semiconductor switches in a configuration with stackable power module stacked above each other according to embodiments disclosed herein may be less over-dimensioned with respect to nominal load conditions, and hence the number of required power semiconductor switches or power semiconductor dies may be reduced.

Particularly for power semiconductor switching devices production of heat is normally associated with switching cycles of the power semiconductor switching device. Power semiconductor switching devices normally produce a significant amount of heat for a short time period associated with a switching cycle of the power semiconductor switching device from ON to OFF or from OFF to ON. During other time periods of operation, such power semiconductor switching devices do not produce significant heat. Therefore, normally a power semiconductor switching device must be configured such as to withstand the heat produced in the course of a switching cycle, and thus is over-dimensioned when considering the average amount of heat produced. In the stackable power module 10 each of the first and second conductive structures 60, 80 has a thermal capacity sufficiently large to take up an amount of thermal energy generated during a single switching cycle of the power semiconductor device 50 with a moderate, increase in temperature as a result of the switching cycle. Thus, the increase in temperature of the stackable power module 10 resulting from a single switching cycle of the power semiconductor device 50 never exceeds a critical threshold. Thermal energy produced in a single switching cycle may be buffered by the conductive structure.

Each of the conductive structures 60, 80 has a contact region forming a conductive contact layer 62, 82 in contact with one side of the power semiconductor device 50. The conductive contact layer 62 of the first conductive structure 60 is in contact with the top side of the semiconductor die (contact pad "S"). The conductive contact layer 82 of the second conductive structure 80 is in contact with the bottom side of the semiconductor die (contact pad "D"). In order to provide a sufficiently large thermal capacity, the conductive contact layer in contact with the one side of the power semiconductor device is relatively thick and made of a material having a high specific thermal capacity. Each of the conductive contact layers 62, 82 has a thickness of at least half the thickness of the thickness of the semiconductor chip or die of the power semiconductor device 50. In the embodiment of FIG. 1, each of the conductive contact layers 62, 82 in contact with the top side and bottom side of the power semiconductor device 50, respectively, has thickness of at least 60 μm. In some embodiment, the thickness of the conductive contact layers 62, 82 may be even larger, e.g. 100 μm or more, or even 200 μm or more. A suitable material for the conductive contact layers 62, 82 is copper.

As the conductive contact layers 62, 82 are in direct contact with the respective contact pads S and D of the power semiconductor chip or die of the power semiconductor device 50, the conductive contact layers 62, 82 can take up thermal energy very quickly and thus act as thermal buffers with respect to pulsed thermal energy produced during a switching cycle of the power semiconductor device 50.

As indicated in FIG. 1, the conductive contact layers 62, 82 are in contact with the power semiconductor device 50 over a substantial contact area. The contact area may cover the top side or bottom side of the power semiconductor chip or die of the power semiconductor device 50.

In order to further enhance the thermal capacity of the first and second conductive structures 60, 80, each of the first and second conductive structures 60, 80 may form an extension 64, 84 towards the respective contact pad 20, 24 provided on the module body 12. The first conductive structure 60 is connected to a contact pad S on the top side of the semiconductor die of the power semiconductor device 50, and hence the extension 64 extends to the contact pad 20 on the top side 14 of the module body 12. The second conductive structure 80 is connected to a contact pad D on the bottom side of the semiconductor die of the power semiconductor device 50, and hence the extension 84 extends towards the bottom contact pad 24 on the bottom side 16 of the module body 12. By forming the extensions 64, 84 the mass of conductive material available for taking up thermal energy is increased and hence the first and second conductive structures 60, 80 are able to take up a larger amount of thermal energy associated with a switching cycle of the power semiconductor device 50.

To further improve transport of thermal energy delivered to the top contact pad 20 by the first conductive structure 60, or to the bottom contact pad 24 by the second conductive structure 80, the stackable power module 10 further comprises first and second thermally conductive inlays 66, 86. The first thermally conducting inlay 66 thermally connects its corresponding top contact pad 20 on the top side 14 of the module body 12 to its corresponding bottom contact pad 26 on the bottom side 16 of the module body 10. The second thermally conducting inlay 86 thermally connects its corresponding bottom contact pad 24 on the bottom side 16 of the module body 12 to its corresponding top contact pad 18 on the top side 16 of the module body 10. Particularly, the first thermally conductive inlay 66 thermally connects the extension 64 of the first conductive structure 60 connected to the contact pad 20 on the top side 14 of the module body 12 to the corresponding contact pad 26 on the bottom side 16 of the module body 12. The second thermally conductive inlay 86 thermally connects the extension 84 of the second electrically conductive structure 80 connected to the contact pad 24 on the bottom side 16 of the module body 12 to the corresponding contact pad 18 on the top side 14 of the module body 12.

While a predominantly electrical connection is provided via the layers 30, 32 extending along a contour of the module body 12, the respective thermally conductive inlays 66, 86 are embedded in the module body 12 and provide a thermally conductive path through the module body 12 such as to directly connect the contact pads 20, 18 provided on the top side 14 of the module body 12 to their corresponding contact pads 26, 24 on the bottom side 16 of the module body 12. As best visible in FIG. 3, in an SSPC with a plurality of power semiconductor chip modules 10 stacked above each other, the thermally conductive inlays 66, 86 of each of the power modules 10 are vertically aligned with each other. Thus the thermally conductive inlays 66, 86 provide a straight path for transport of heat by thermal conduction away from the power semiconductor modules 10 towards heat sinks provided by a printed circuit board or substrate 100 to which the stacked power semiconductor modules 10 are attached (see the downward arrows T in FIGS. 1, 2 and 3) and/or by a cooling device 90 mounted on the top side of an uppermost power semiconductor module 10 (see the upward arrows T in FIGS. 1, 2 and 3). Thus, the thermally conductive inlays 66, 86 provide for efficient transport of heat away from the stackable modules 10. The thermally conductive inlays 66, 86 may be both thermally conductive and electrically conductive. The same materials may be used for providing the thermally conductive inlays 66, 86 as used for providing the conductive structures 60, 80. Particularly, the thermally conductive inlays 66, 86 may be formed from a metal or metal alloy having a good thermal conductivity, e.g. copper, silver, gold, tin, molybdenum, aluminum, or any suitable alloy of these materials (e.g. copper invar composites). Copper is a particularly well suited material for the thermally conductive inlays 66, 86.

As visible in FIG. 1, each of the contact pads 18, 20, 22 provided on the top side 14 of the module body 12 has the same contour as its corresponding contact pad 24, 26, 28 provided on the bottom side 16 of the module body 12 (the term "corresponding contact pad" refers to the contact pad to which the respective contact pad is electrically connected and which it faces via a thickness direction of the module body 12). Thus, the top side 14 and the bottom side 16 of the stackable power semiconductor module 10 are mirror symmetric to each other. This configuration optimises the transport of heat in vertical direction between adjacent stacked power semiconductor chip modules 10, i.e. the transport of heat from a contact pad 24, 26, 28 on the bottom side 16 of an upper power module 10 to the corresponding contact pad 18, 20, 22 on the top side 14 of an adjacent power module 10 below.

Figure 2:
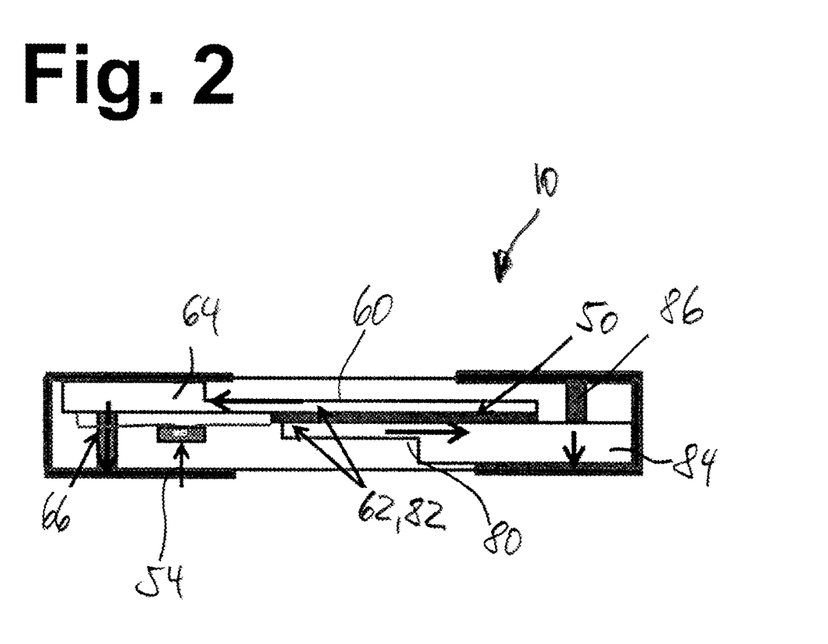
FIG. 2 shows a schematic view corresponding to the cross sectional view of FIG. 1, of a further power module according to an embodiment of SMD part.

The embodiment of a power semiconductor chip 10 shown in FIG. 2 corresponds to FIG. 1. The only difference is that an additional passive electronic device, in this case a SMD resistor, R is provided on the semiconductor die of the power semiconductor device 50.

FIG. 3 shows a solid state power controller comprising a printed circuit board 100 and a plurality of stackable power modules 10 as shown in FIGS. 1 and 2. in FIG. 3, three stackable power modules 10 are stacked above each other. The lowermost of the stacked power modules 10 is mounted to the printed circuit board via SMT. Any suitable number of the stackable power modules 10 may be stacked above each other. Furthermore, a cooling structure 90 is mounted to the upper side of the uppermost of the stackable power modules 10. An additional SMD device 102 is mounted to the printed circuit board 100.

The embodiments described provide an improved configuration for a power module allowing more efficient assembly and/or better utilization of space while still providing sufficient heat dissipation capability.

Increase of power density may be achieved by stacking of power modules. Hence, more power semiconductor devices, particularly power semiconductor switches, may be placed on a printed circuit board (PCB) of a given size. The stackable power module comprises a module body having a top side and a bottom side provided with top and bottom contact pads. Each of the top contact pads is electrically connected to a corresponding bottom contact pad. Thus, the individual modules can be stacked on top of each other with the bottom contact pads of an upper module contacting the corresponding top contact pads of the lower module.

At least one power semiconductor device, in particular a power semiconductor switch, is embedded in the module body. In particular, the power semiconductor device may be a bare semiconductor die, i.e. a "naked" semiconductor chip. A semiconductor chip or die is an electrical power component or integrated circuit build up on a semiconductor wafer, e.g. using MOSFET, IGBT, CMOS or other technology for constructing integrated circuits based on semiconductor wafers. The expression "bare" or "naked" is understood in the sense that the semiconductor chip or die is in a state after dicing from a larger waver, but without applying any leads, packaging or other back-end treatments. A metallization (e.g. by copper) may be provided to the die to form contact pads on its top and/or bottom surfaces.

Particular examples for power semiconductor devices include semiconductor switches, including at least one of an insulated gate bipolar transistor (IGBT), a metal-oxide semiconductor field effect transistor (MOSFET), or a thyristor. Other power semiconductor devices like Schottky diodes, power diodes, capacitors, resistors may be provided in combination with power semiconductor switches. In particular, the power semiconductor device may be an integrated circuit comprising any combination of these power semiconductor devices on a semiconductor die formed in semiconductor technology, e.g. using CMOS technology. The integrated circuit may include e.g. bridge circuits as used for power converters and/or power inverters, operating amplifier circuits, or other integrated circuits.

The power semiconductor device may be made in a number of semiconductor die technologies, e.g. Si, GaN, SiC. Power semiconductor devices used in typical applications like aircraft power conversion typically are based on silicon carbide SiC which has better thermal characteristics than mere silicon based power devices. SiC based power devices may operate up to temperatures as high as 250° C. and produce less heat than corresponding silicon based devices. However, even for SiC based power devices efficient transfer of heat away from the semiconductor device is a main requirement.

At least one conductive structure is provided in the stackable power module. The at least one conductive structure connects the power semiconductor device to a respective contact pad provided on the module body. For example, the contact may be provided on the top side of the module body, particularly in case the conductive structure is connected to a contact pad on the top side of the semiconductor die carrying the power semiconductor device. Correspondingly, the contact may be provided on the bottom side of the module body, particularly in case the conductive structure is connected to a contact pad on the bottom side of the semiconductor die carrying the power semiconductor device.

Particularly for power switching devices production of heat is normally associated with switching cycles of the power switching device. Power switching devices normally produce a significant amount of heat for a short time period associated with a switching cycle of the power switching device from ON to OFF or from OFF to ON. During other time periods of operation, such power switching devices do not produce significant heat. Therefore, normally a power switching device must be configured such as to withstand the heat produced in the course of a switching cycle and thus is over-dimensioned when considering the average amount of heat produced. In the stackable power module disclosed herein, the at least one conductive structure in configured in such a way that a thermal capacity of the conductive structure is sufficiently large to take up an amount of heat generated during a switching cycle of the at least one power semiconductor device with almost no, or only a moderate, increase in temperature as a result of the switching cycle. Thus, the increase in temperature of the stackable power module resulting from a switching cycle never exceeds a critical threshold. Thermal energy produced in a single switching cycle may be buffered by the conductive structure.

As used herein a structure is considered conductive in case the structure has both electrically conductive and thermally conductive characteristics.

Compared to known technologies the embodiments described herein allow a further improvement in space utilization by stacking power modules components on top of each other, such that only the lowermost of these stacked modules is mounted to a printed circuit board (PCB) or similar. This allows to utilise the available space on the mounting surfaces of the PCB more efficiently. Manufacturing efforts are also reduced, because wire bonding steps are unnecessary. In addition, heat management may even be improved, since short term heat fluctuations due to switching cycles of individual power semiconductor switches may be buffered by the respective conductive structure having a large thermal capacity, and the buffered thermal energy may be efficiently transported away (i.e. to the PCB) over a longer time period in between successive switching cycles of the respective power semiconductor device.

Modular PCB assemblies can be constructed using the configuration of stacked power modules set out above. In this way, fully operative solid state power controllers (SSPCs) may be created using stacked power semiconductor chip modules. Parallel switching of the semiconductor switches in each of the stacked modules can be realized by connecting the respective contact pads on the top side of a lower module to the corresponding contact pads on the bottom side of the module stacked above. Such modules can be configured as Surface Mount Technology (SMT) processable PCB modules to be used in larger circuit designs. Through-Hole Mount Technology processable PCB modules may be created as well by additionally providing the PCB assembly with the respective leads.

This disclosure shows that sufficient heat dissipation can be realized by contacting conductive contact layers having a sufficiently large thermal capacity to the bare semiconductor die in which the power switching device is formed. The conductive contact layers may be made of any suitable electrically conductive material having a thermal capacity as large as possible. E.g. the conductive structures may be made of copper, silver, gold, tin, molybdenum, aluminum, or any suitable alloy of these materials (e.g. copper invar composites). Copper is a particularly well suited material. In addition to being electrically conductive and having a relatively large thermal capacity, such structures may be also very efficient with respect to transport of heat, and may be thermally connected to the respective contact pads at the upper and/or lower sides of the module body. In this way, the conductive structure acts as a heat sink with respect to heat produced by the power semiconductor device in the course of a switching cycle. The large thermal capacity of the conductive structure provides for a buffer for temporarily taking up thermal energy produced in the course of a switching cycle. The thermal conductivity of the conductive structure together with its connection to the contact pads provides for an efficient path for transporting thermal energy from the stackable power module to a heat sink, e.g. the PCB or a cooling structure mounted to the top side of a stack of power modules. Heat management provided in this way may be more efficient than heat management achievable with single, non-stacked power modules. Thus, the power semiconductor switches in a configuration with stackable power module stacked above each other according to embodiments disclosed herein may be less over-dimensioned, and hence the number of required power semiconductor switches or power semiconductor dies may be reduced.

In particular embodiments, any of the following optional features may be realized. It goes without saying that any of these features may be realized in isolation or may be realized in connection with other features:

The stackable power module may comprise a first conductive structure connected to a first side of the power semiconductor device. Additionally or alternatively, the stackable power module may comprise a second conductive structure connected to a second side of the power semiconductor device opposite to the first side. For example, the first conductive structure may connect a top side of the power semiconductor device to a top contact pad on the top side of the module body. The second conductive structure may connect a bottom side of the power semiconductor device to a bottom contact pad on the bottom side of the power semiconductor device. In embodiments where the power semiconductor device is a power semiconductor switch, one of the first and second conductive structures may be connected to a drain of the power semiconductor device and the other of the first and second conductive structures may be connected to a source of the power semiconductor device. A third conductive structure may be connected to a gate of the power semiconductor device. Depending on the layout of the power semiconductor device, the third conductive structure may connect the gate to a contact pad on the top side of the module body or on the bottom side of the module body.

In further embodiment of the stackable power module the at least one conductive structure may have a contact region forming a conductive contact layer in contact with one side of the power semiconductor device, i.e. the top side or the bottom side of the semiconductor chip or die. In order to provide a sufficiently large thermal capacity, the conductive contact layer in contact with the one side of the power semiconductor device may be relatively thick and may be made of material having a high specific thermal capacity. For example, in applications like an SSPC it has turned out advisable to provide the conductive contact layer in contact with the one side of the power semiconductor device with a thickness of at least half the thickness of the thickness of the semiconductor chip or die of the power semiconductor device. Particularly, in an application for an SSPC each of the conductive contact layers in contact with the top side and bottom side of the power semiconductor device, respectively, may have a thickness of at least 60 µm. The thickness of the conductive contact layer may be even larger, e.g. 100 µm or more, or even 200 µm or more. A suitable material for conductive contact layer in contact with the one side of the power semiconductor device is copper.

The thicker the conductive contact layer in contact with the one side of the power semiconductor device is, the larger is the thermal capacity provided and the more thermal energy may be taken up by the conductive contact layer without a strong increasing temperature. For this reason the conductive contact layer can take up thermal energy very quickly.

In order to improve the thermal contact the conductive contact layer may be in contact with the power semiconductor device over a substantial contact area. Ideally, the conductive contact layer in contact with the power semiconductor device may extend over a substantial area of the first side or the second side of the power semiconductor device. The larger the area of contact the faster will be the take up of thermal energy by the conductive contact layer.

In order to further enhance the thermal capacity of the at least one conductive structure, the at least one conductive structure may form an extension towards the top contact pad on the top side of the module body (in case the at least one conductive structure is connected to a die pad on the top side of the semiconductor die) or towards the bottom contact pad on the bottom side of the module body (in case the at least one conductive structure is connected to a die pad on the top side of the semiconductor die). In this way, the mass of material available for taking up thermal energy is increased and hence the at least one conductive structure is able to take up a larger amount of thermal energy associated with a switching cycle of the power semiconductor device.

Since each of the top contact pads is electrically connected to a corresponding bottom contact pad, in principle thermal energy delivered to a respective top contact or bottom contact pad by the conductive structure can be transported to the contact pad on the opposite side of the module body via this electrical connection. In order to improve such conduction of thermal energy between corresponding contact pads on opposite sides of the module body, the stackable power module may comprise at least one thermally conductive inlay thermally connecting a respective top contact pad on the top side of the module body to its corresponding bottom contact pad on the bottom side of the module body. Such inlay may be provided instead of a normal electrical connection between the corresponding top and bottom contact pads. Preferably, a thermally conductive inlay is provided in addition to an electrical connection between the corresponding top and bottom contact pads. For example, a predominantly electrical connection may be provided along a contour of the module body, form a contact pad provided on an top side along a lateral side of the module body to a corresponding contact pad provided on a bottom side. Additionally, a thermally conductive inlay may be provided through the module body such as to directly connect the contact pad provided on the top side of the module body to the contact pad on the bottom side of the module body. The thermally conductive inlay provides for efficient transport of heat from the stackable power module towards a substrate or printed circuit board by thermal conduction from the top side of a module body towards the bottom side of that module body. The thermally conductive inlay may be both thermally conductive and electrically conductive. The same materials may be used for providing the thermally conductive inlay as used for providing the conductive structure. Particularly, the thermally conductive inlay may be formed from a metal or metal alloy having a good thermal conductivity, e.g. copper, silver, gold, tin, molybdenum, aluminum, or any suitable alloy of these materials (e.g. copper invar composites). Copper is a particularly well suited material for the thermally conductive inlay.

Particularly, the stackable power module may comprise a first thermally conductive inlay thermally connecting the extension of the first conductive structure connected to the contact pad on the top side of the module body to the corresponding contact pad on the bottom side of the module body. Further, the stackable power module may comprise may comprising a second thermally conductive inlay thermally connecting the extension of the second electrically conductive structure connected to the contact pad on the bottom side of the module body to the corresponding contact pad on the top side of the module body.

In further embodiments, each of the contact pads provided on the top side of the module body may have the same contour as its corresponding contact pad provided on the bottom side of the module body (i.e. the contact pad to which it is electrically connected which it faces via a thickness direction of the module body). In such arrangement, the top side and the bottom side of the stackable power semiconductor module are mirror symmetric to each other. This configuration optimises the transport of heat in vertical direction between adjacent stacked power modules, i.e. the transport of heat from a contact pad on the bottom side of an upper power module to the corresponding contact pad on the top side of an adjacent power module below, since the corresponding contact pads of both adjacent stacked power semiconductor modules about each other over a maximum possible contact area.

In further embodiments, a solid state power controller may be provided, comprising a printed circuit board and a plurality of stackable power modules as described herein. Any suitable number of the stackable power modules may be stacked above each other, with a lowermost of the stacked power modules being attached to the printed circuit board, e.g. via SMT or by inserting the lowermost of the stacked power semiconductor modules into a socket which itself is mounted to the printed circuit board. In further embodiments of the solid state power controller a cooling structure, or a further module comprising passive electronic devices, may be mounted to the upper side of the uppermost of the stackable power modules.

The invention claimed is:

1. A stackable power module, comprising
a module body having a top side with top contact pads and a bottom side bottom contact pads, each of the top contact pads electrically connected to a corresponding bottom contact pad;
at least one power semiconductor device, or at least one circuitry including at least one power semiconductor device connected to at least one other electrical component, embedded in the module body,
a first conductive structure connecting the power semiconductor device to respective top connective contact pads and a second conductive structure connecting the power semiconductor device to bottom contact pads;
wherein the first and second conductive structure has a thermal capacity sufficient to take up an amount of heat generated during a switching cycle of the at least one power semiconductor device without increasing temperature above a critical threshold;
wherein:
the first conductive structure is connected to a first side of the power semiconductor device and the second conductive structure is connected to a second side of the power semiconductor device opposite to the first side,
the first conductive structure has a first contact region forming a first conductive contact layer in contact with the first side of the power semiconductor device, and the second conductive structure has a second contact region forming a second conductive contact layer in contact with the second side of the power semiconductor device, and
each of the first and second conductive contact layers extends over a substantial area of the first side and the second side of the power semiconductor device, respectively.

2. The stackable power module according to claim 1, wherein the first conductive structure connects the first side of the power semiconductor device to a top contact pad on the top side of the module body and the second conductive structure connects the second side of the power semiconductor device to a bottom contact pad on the bottom side of the module body.

3. The stackable power module according to claim 1, wherein one of the first and second conductive structures is connected to a drain (D) of the power semiconductor device and the other of the first and second conductive structures connected to a source (S) of the power semiconductor device.

4. The stackable power module according to claim 1, wherein the power semiconductor device is provided as bare semiconductor die; particularly with a specific surface finish having a configuration of a metallization, e.g. from a copper material.

5. The stackable power module according to claim 1, wherein the power semiconductor device includes at least one of an insulated gate bipolar transistor power diode (IGBT), a metal-oxide semiconductor field effect transistor (MOSFET), a thyristor, a Schottky diode, a power diode, or combinations thereof, wherein the power semiconductor device particularly is made in SiC, GaN, or Si technology.

6. The stackable power module according to claim 1, wherein the at least one of the first or the second conductive structure has the conductive contact layer in contact with one side of the first or second side of the power semiconductor device.

7. The stackable power module according to claim 1, wherein the first and second conductive structures form a first extension towards the top contact pad on the top side of the module body and a second extension towards the bottom contact pad on the bottom side of the module body, respectively.

8. The stackable power module according to claim 1, further comprising at least one thermally conductive inlay thermally connecting one of the top contact pads on the top side of the module body to the corresponding bottom contact pad on the bottom side of the module body.

9. The stackable power module according to claim 7, comprising a first thermally conductive inlay thermally connecting an extension of the first conductive structure connected to the contact pad on the top side of the module body to the corresponding contact pad on the bottom side of the module body; and comprising a second thermally conductive inlay thermally connecting an extension of a second electrically conductive structure connected to a contact pad on the bottom side of the module body to a corresponding contact pad on the top side of the module body.

10. The stackable power module according to claim 8, wherein the first and second conductive structures or the first and second thermally conductive inlays is made of an electrically and thermally conductive material.

11. The stackable power module according to claim 1, wherein each of the top contact pads has the same contour as its corresponding bottom contact pad to which it is electrically connected.

12. The stackable power module according to claim 10, wherein the electrically and thermally conductive material is made of copper, silver, gold, tin, or an alloy comprising any combination thereof.

13. A solid state power controller comprising:
a printed circuit board; and
a plurality of vertically stacked power modules, each comprising:
a module body having a top side with top contact pads and a bottom side provided with bottom contact pads, each of the top contact pads electrically connected to a corresponding bottom contact pad; and
at least one power semiconductor device, or at least one circuitry including at least one power semiconductor device connected to at least one other electrical component, embedded in the module body; and
a first conductive structure and a second conductive structure connecting the power semiconductor device to at least a respective top and bottom contact pads, respectively;
wherein the first and second conductive structures have a thermal capacity sufficient to take up an amount of heat generated during a switching cycle of the at least one power semiconductor device without increasing temperature above a critical threshold;
wherein the first conductive structure is connected to a first side of the power semiconductor device and the second conductive structure is connected to a second side of the power semiconductor device opposite to the first side,
wherein the first conductive structure has a first contact region forming a first conductive contact layer in contact with the first side of the power semiconductor device, and the second conductive structure has a second contact region forming a second conductive layer in contact with the second side of the power semiconductor device,
wherein each of the first and second conductive contact layers over a substantial area of the first side and the second side of the power semiconductor device, respectively, and
wherein the stackable power semiconductor chip modules are stacked above each other.

14. The solid state power controller according to claim 13, wherein a cooling structure or a further module comprising passive electronic devices is mounted to the upper side of the uppermost of the stackable power modules.

* * * * *